(12) United States Patent
Siniscalchi

(10) Patent No.: US 6,927,719 B1
(45) Date of Patent: Aug. 9, 2005

(54) SEGMENTED, CURRENT-MODE DIGITAL-TO-ANALOG CONVERTER

(75) Inventor: Patrick P. Siniscalchi, Sachse, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/794,864

(22) Filed: Mar. 4, 2004

(51) Int. Cl.$^7$ ................................................ H03M 1/66
(52) U.S. Cl. ...................................... 341/144; 341/153
(58) Field of Search ................................. 341/144–153

(56) References Cited

U.S. PATENT DOCUMENTS

| | | | | |
|---|---|---|---|---|
| 4,405,916 | A | * | 9/1983 | Hornak et al. ............... 341/118 |
| 4,958,155 | A | * | 9/1990 | Gulczynski .................. 341/120 |
| 5,283,580 | A | * | 2/1994 | Brooks et al. ............... 341/145 |
| 5,446,455 | A | | 8/1995 | Brooks ........................ 341/145 |
| 5,446,457 | A | * | 8/1995 | Ryat ............................ 341/136 |
| 5,798,723 | A | * | 8/1998 | Fong ............................ 341/136 |
| 5,990,819 | A | | 11/1999 | Fujimori ..................... 341/150 |
| 6,236,347 | B1 | * | 5/2001 | Cheng ........................ 341/145 |
| 6,329,941 | B1 | | 12/2001 | Farooqi ....................... 341/145 |
| 6,424,283 | B2 | | 7/2002 | Bugeja et al. ............... 341/145 |
| 6,486,818 | B1 | | 11/2002 | Nicholson et al. .......... 341/154 |
| 6,489,905 | B1 | | 12/2002 | Lee et al. .................... 341/120 |
| 6,507,296 | B1 | | 1/2003 | Lee et al. .................... 341/120 |
| 6,556,161 | B2 | * | 4/2003 | Nuijten ....................... 341/144 |
| 6,594,304 | B2 | | 7/2003 | Chan ........................... 375/220 |
| 6,621,439 | B1 | | 9/2003 | Bugeja ........................ 341/145 |
| 6,738,006 | B1 | * | 5/2004 | Mercer et al. ............... 341/144 |

* cited by examiner

Primary Examiner—Michael Tokar
Assistant Examiner—Linh V Nguyen
(74) Attorney, Agent, or Firm—J. Dennis Moore; W. James Brady, III; Frederick J. Telecky, Jr.

(57) ABSTRACT

A segmented current mode DAC (200) is disclosed herein having a current matching circuit (260) that compensates for the current mismatch produced by the transistors of each current source. This segmented current mode DAC (200) includes an input stage (210), a first and second controllable current source (270, 220), a current matching circuit (260), and an output switching network (272–274, 222–236). The first controllable current source (270) couples to receive a mirrored current as provided by the input stage (210) to provide a current source output controllable in current increments responsive to the M least significant bits for converting of the digital signal to analog form, where M is less than N. The second controllable current source (220) couples to receive the mirrored current to provide a current source output controllable in current increments responsive to the N–M most significant bits for converting of the digital signal to analog form. The current matching circuit (260) couple between the first and second controllable current sources (270,220) to match the current of the first controllable current source (270) and the second controllable current source (220). Specifically, the current matching circuit (260) connects between each sub-DAC (270,220) to force the drain-to-source voltage of a transistor (252) representing the first bit of the MSB binary weighted sub-DAC (220) to be the same as the drain-to-source voltage of the transistor (278) representing the LSB thermometer decoded sub-DAC (270).

12 Claims, 2 Drawing Sheets

SEGMENTED, CURRENT-MODE DIGITAL-TO-ANALOG CONVERTER

FIELD OF THE INVENTION

The present invention relates to digital-to-analog converters (DACs), and, more particularly, to a segmented current mode DAC.

BACKGROUND OF THE INVENTION

Conversion from digital-to-analog (D/A) is the process of converting digital codes into a continuous range of analog signal levels. Digital codes are typically converted to analog voltages by assigning a voltage weight, or current weight, to each bit in the digital code and summing the voltage or current weights of the entire code. A digital-to-analog converter (DAC) having weights using the power of two is called a binary weighted DAC. DACs that produce analog current outputs usually have a faster settling time and better linearity than those that produce a voltage output.

Major factors that determine the quality of performance of DACs are resolution, sampling rate, speed, and linearity. The accuracy of the DAC's measurement and conversion is typically specified by the converter's linearity. "Integral linearity" is a measure of linearity over the entire conversion range. It is defined as the deviation from a straight line drawn between the maximum point and through zero (or the offset value) of the conversion range. "Differential linearity" is the linearity between adjacent steps of the analog output. In addition, differential linearity is a measure of the monotonicity of the converter. The converter is said to be monotonic if increasing input values result in increasing output values.

As is well known in the art, a "segmented" DAC design converts digital codes to analog signals by activating a number of weighted segments proportional to the input digital code and summing the activated segments to form the analog output signal. Current source mismatch due to process variations in current-mode digital-to-analog data converters (DAC's) results in linearity errors that reduce resolution and accuracy.

Calibration can be applied to the current sources to improve current matching and performance. In many applications employing current-mode DACs of more than 7–8 bits, some form of calibration is required, even if the DAC is segmented into MSB and LSB sub-DACs. In one calibration scheme, primary current sources of the DAC are calibrated against a single reference current source. A redundant current source is provided to replace a primary current source that is being calibrated, such that the output of the DAC does not have to be disabled to calibrate the primary current sources. The redundant current source is also calibrated during operation. As explained below, calibration is applied to one current source at a time and a calibration clock controls the sequence of calibration. The calibration operation changes from one current source to the next at the rising (or falling) edge of the calibration clock. As this process continues, each current source is periodically calibrated.

This method presents a problem since periodic calibration, which involves switching of currents, introduces a tone in the output spectrum of the DAC at the frequency of the calibration clock. This reduces DAC performance and the performance of other circuitry including these calibrated current sources. The problem can be further compounded if a segmented DAC is used. For example, when two or more current sources from different segments may be calibrated at the same time if the same calibration clock is shared between segments. This further increases the energy of the undesired tone. Furthermore, the required calibration clock and the dynamically exchanged current source elements in the array add to the cost and complexity of the DAC. Moreover, these required features add to the noise generated from the switching of current source elements for calibration and, thereby, may not be tolerable.

Thus, a need exists for a more efficient segmented current mode DAC that compensates for transistor mismatch.

The present invention is directed to overcoming, or at least reducing the effects of one or more of the problems set forth above.

SUMMARY OF THE INVENTION

To address the above-discussed deficiencies of a segmented current mode DAC, the present invention teaches a segmented current mode DAC having a current matching circuit that compensates for the current mismatch produced by the transistors of each current source. A digital-to-analog converter for converting an N bit digital signal to analog form couples to receive a current reference signal according to the present invention includes an input stage, a first and second controllable current source, a current matching circuit, and an output switching network. The input stage couples to receive the current reference signal and the cascode voltage to provide a mirrored current. The first controllable current source couples to receive the mirrored current to provide a current source output controllable in current increments responsive to the M least significant bits for converting of the digital signal to analog form, where M is less than N. The second controllable current source couples to receive the mirrored current to provide a current source output controllable in current increments responsive to the N–M most significant bits for converting of the digital signal to analog form. The current matching circuit couple between the first and second controllable current sources to match the current of the first controllable current source and the second controllable current source. The output switching network includes switches that connect to the first and second controllable current source.

In a second embodiment, the current matching circuit comprises an operational amplifier. The operational amplifier maintains the drain to source voltage of a transistor in the second controllable current source to equal the drain to source voltage of the transistor in the first controllable current source.

In a third embodiment, the first controllable current source represents the most significant bit (MSB) sub-DAC and the second controllable current source represents the least significant bit (LSB) sub-DAC. Ultimately, the current matching circuit minimizes the mismatch error between these MSB and LSB sub-DACs.

The DAC in accordance with the present invention requires no calibration, clocks or laser/fuse trimming. In addition, this DAC can achieve higher linearity by reducing errors due to device mismatch while having reduced complexity and occupying smaller die area.

These and other features and advantages of the present invention will be understood upon consideration of the following detailed description of the invention and the accompanying drawings.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF PREFERRED EMBODIMENTS

The present invention will now be described more fully hereinafter with reference to the accompanying drawings, in which embodiments of the invention are shown. This invention may, however, be embodied in many different forms and should not be construed as limited to the embodiments set for the herein. Rather, these embodiments are provided so that this disclosure will be thorough and complete, and will fully convey the scope of the invention to those skilled in the art.

The present invention is best understood by comparison with the prior art. Hence, this detailed description begins with a discussion of known segmented current mode DAC apparatus shown in FIG. 1.

Figure 1:
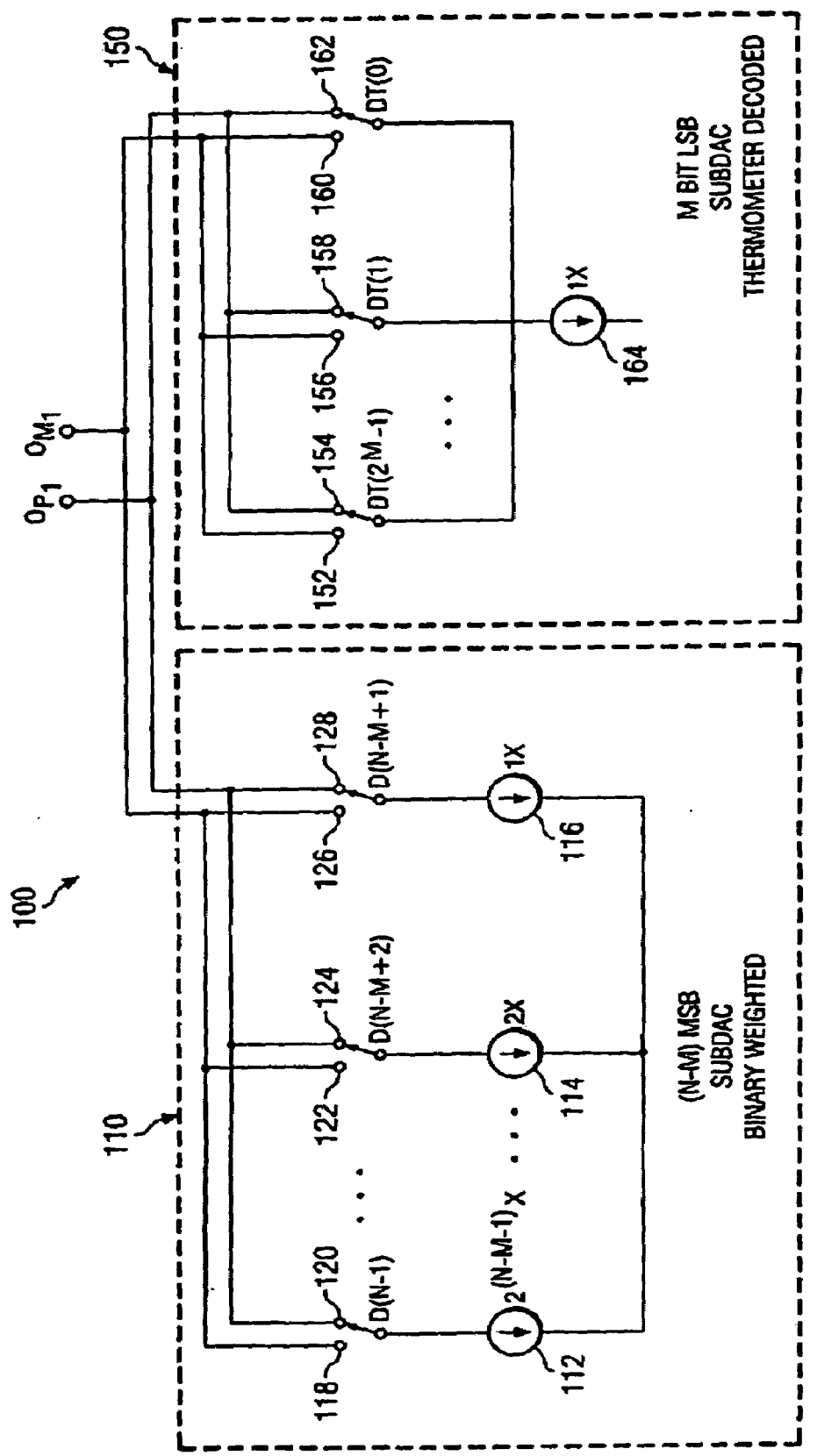
FIG. 1 illustrates a known digital-to-analog converter (DAC)

The known N-bit segmented current mode DAC shown FIG. 1 includes two sub-DACs 110 and 150. The first controllable current source 110 is a binary weighted sub-DAC that represents the MSB bits: $(M+1)^{th}$ bit through to the $N^{th}$ bit. Current sources 112–116 are binary weighted as shown $[2^{(n)} X]$ represents the weight of each current source, where n=0, 1, 2 . . . (N−M−1). Switches 118–128, represented by D(N−M+1), D(N−M+2), . . . D(N−1), are used as part of the switching network that switches the current sources to either output, $O_{P1}$ and $O_{M1}$. The second controllable current source 150 is a thermometer decoded sub-DAC that represents the first M bits of the DAC or the LSB sub-DAC. There is only one current source 164 for the thermometer decoded sub-DAC. Current source 164 couples to switches 152–162 represented by DT(0), DT(1), . . . DT($2^M$−1). The output of each sub-DAC is summed together at $O_{P1}$ and $O_{M1}$.

Binary weighted decoding adds a $2^{(n)}$ current source for every bit of the code. As shown, the first current source is a '1X', the second is a '2X', the third is a '4X', and the last is a '$2^{(N-M-1)}$X'. In the alternative, thermometer decoding uses the 1× current source for all bits in the sub-DAC. With each increase in the thermometer code, an equal portion of that current source represents each bit of the code. Thereby, with each bit, there is an increase in current. Mismatches occur with reference to the MSB binary weighted sub-DAC having a differing amount of current supplied from its current sources than that which is supplied from the current source of the LSB thermometer decoded sub-DAC. Moreover, when the number of bits increases towards a higher range, i.e. 7–8 bits, increased mismatches occur with reference to the current supplied by each sub-DAC.

Figure 2:
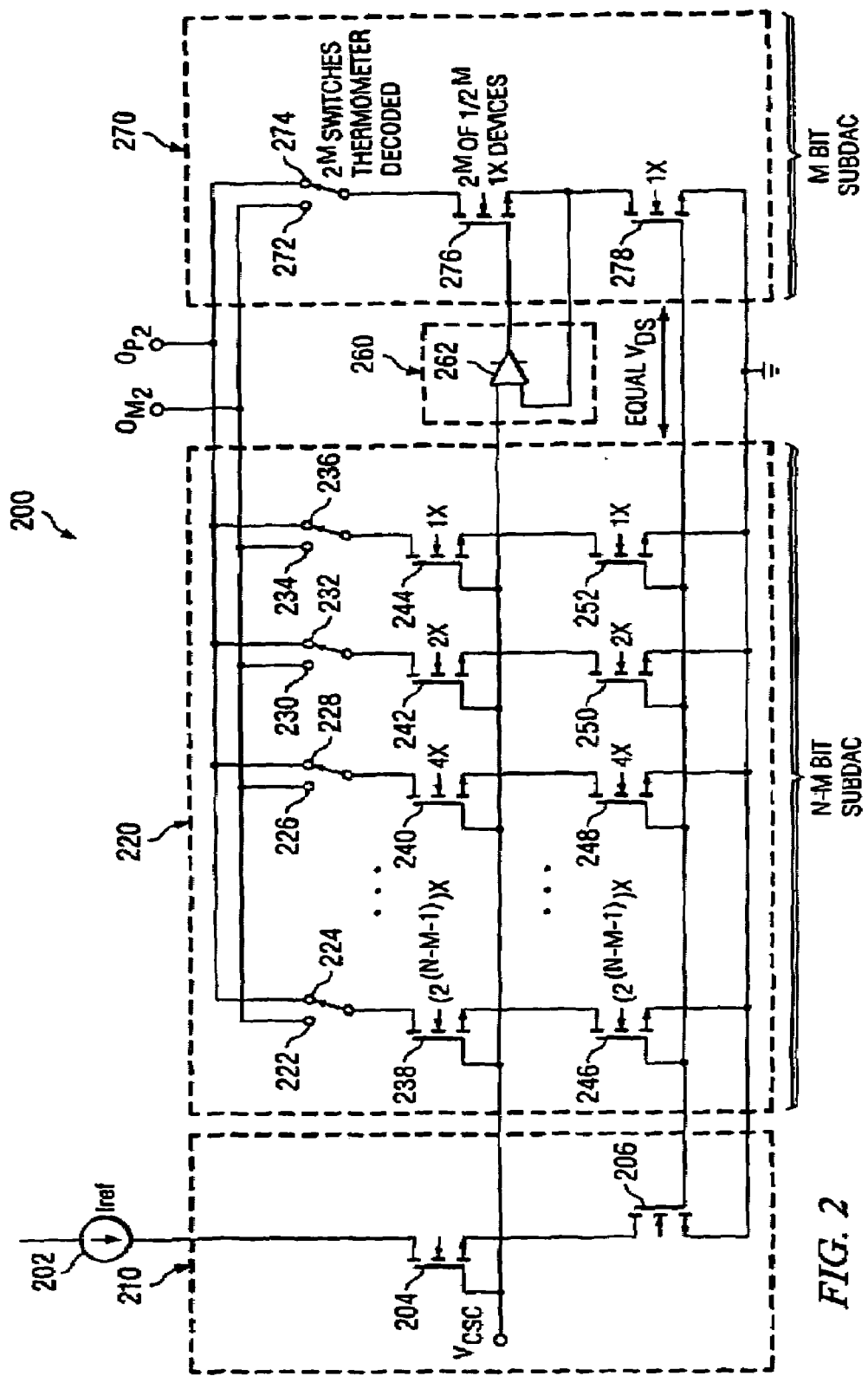
FIG. 2 displays a DAC according to the present invention.

FIG. 2 displays the N-bit segmented current mode DAC 200 in accordance with the present invention. N-bit segmented current mode DAC 200 includes a current reference source 202, an input stage 210, two sub-DACs 220 and 270, and a current matching circuit 260. Input stage 210 includes a first and second transistor, 204 and 206, coupled to mirror the current reference signal supplied by current reference source 202. The first controllable current source 220 is a binary weighted sub-DAC that represents the MSB bits: $(M+1)^{th}$ bit through to the $N^{th}$ bit. As shown, transistors 246–252 provide current mirroring of the reference current provided by current source 202 through transistor 206. Current sources 246–252 are binary weighted as shown $[2^{(n)} X]$ represents the weight of each current source, where n=0, 1, 2 . . . (N−M−1). Cascoded transistors 238–244 mirror the current from transistor 204. Switches 222–236 are used as part of the switching network that switches the output from either output, $O_{P2}$ and $O_{M2}$.

The second controllable current source 270 is a thermometer decoded sub-DAC that represents the first M bits of the DAC or the LSB sub-DAC. There is only one current source 278 for the thermometer decoded sub-DAC. The bold marking denotes a plurality of transistors 276 coupled to provide cascoding of the current supplied by current source 278. The drain of each transistor as represented by transistor 276 couples to a respective one of switches 272–274. Furthermore, note that switches 272–274 represent a plurality of switch pairs as denoted by the bold lines.

Current matching circuit 260 couples between transistor 244 and transistor 276 to match the drain to source voltages of transistor, 252 and 278, and, hence, the current between the two sub-DACs, 220 and 270. As shown, the current matching circuit 260 connects between each sub-DAC, 220 and 270, for rectifying the drain-to-source voltage of the transistor 252 representing the first bit of the MSB binary weighted sub-DAC 220 to be the same as the drain-to-source voltage of the transistor 278 representing the LSB thermometer decoded sub-DAC 270. Specifically, operational amplifier 262 includes a first and a second input connected to the source of each of transistors, 244 and 276, respectively. The output of operational amplifier 262 connects to the gate nodes of each transistor denoted by transistor 276 to provide a feedback loop through transistor 276 and back toward the second input of operational amplifier 262. This feedback loop maintains the drain-to-source voltage of the transistor 278 to the equivalent voltage of the drain-to-source voltage of the transistor 252.

Those of skill in the art will recognize that the physical location of the elements illustrated in FIG. 2 can be moved or relocated while retaining the function described above. For example, the MSB sub-DAC 220 may be implemented using a thermometer decoded sub-DAC, while the LSB sub-DAC 270 can be implemented using a binary weighted sub-DAC. In addition, the DAC may be either a segmented current mode DAC or a segmented voltage mode DAC. Furthermore, the input stage may be configured to generate the cascode voltage as oppose to receiving it externally.

Advantages of this design include but are not limited to a segmented current mode DAC having a current matching circuit that compensates for transistor mismatch but also to a design that is simple and cost effective.

The reader's attention is directed to all papers and documents which are filed concurrently with this specification and which are open to public inspection with this specification, and the contents of all such papers and documents are incorporated herein by reference.

All the features disclosed in this specification (including any accompany claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

I claim:

1. A digital-to-analog converter for converting an N bit digital signal to analog form coupled to receive a current reference signal and a cascode voltage, comprising:
   an input stage coupled to receive the current reference signal and the cascode voltage to provide a mirrored current;
   a first controllable current source coupled to receive the mirrored current to provide a current source output controllable in current increments responsive to the M least significant bits for converting of the digital signal to analog form, where M is less than N;
   a second controllable current source coupled to receive the mirrored current to provide a current source output controllable in current increments responsive to the N–M most significant bits for converting of the digital signal to analog form;
   a current matching circuit coupled between the output of the first controllable current source and the input of the second controllable current source to match the current of the first controllable current source and the second controllable current source; and
   an output switching network, having a plurality of switches, the output switching network coupled to the first controllable current source and the second controllable current source.

2. A digital-to-analog converter for converting an N bit digital signal to analog form as recited in claim 1, wherein the input stage comprises:
   a first transistor, having a gate, a drain and a source, the drain coupled to receive the current reference signal; and
   a second transistor, having a gate, a drain and a source, the drain coupled to the source of the first transistor, the source coupled to a ground terminal, the gate coupled to receive the current reference signal.

3. A digital-to-analog converter for converting an N bit digital signal to analog form as recited in claim 1, wherein the current matching circuit comprises an operational amplifier, having a non-inverting input, an inverting input and an output.

4. A digital-to-analog converter for converting an N bit digital signal to analog form as recited in claim 3, wherein the first controllable current source is a thermometer coded current source and the second controllable current source is a binary weighted current steering current source.

5. A digital-to-analog converter for converting an N bit digital signal to analog form as recited in claim 4, wherein the first controllable current source, having a first current output and a second current output, comprises:
   a first plurality of transistors, each having a gate, a drain and a source, the source of each of the first plurality of transistors coupled to the inverting input of the operational amplifier of the current matching circuit, the gate of each of the first plurality of transistors coupled to the output of the operational amplifier of the current matching circuit;
   a second transistor, having a gate, a drain and a source, the source coupled to the ground terminal, the gate coupled to receive the current reference signal, the drain coupled to each source of the first plurality of transistors; and
   wherein a corresponding pair of the plurality of switches of the output switching network coupled to the drain of a corresponding one of the first plurality of transistors to switch the output current to the first and the second current output, wherein the corresponding pair including a first switch and a second switch, the first switch coupled to the first current output, the second switch coupled to the second current output.

6. A digital-to-analog converter for converting an N bit digital signal to analog form as recited in claim 4, wherein the second controllable current source, having a first current output and a 5 second current output, comprises:
   a first plurality of transistors, each having a gate, a drain and a source, the source of each of the first plurality of transistors coupled to the ground terminal, the gate of each of the first plurality of transistors coupled to receive the current reference signal;
   a second plurality of transistors, each having a gate, a drain and a source, the source of each of the second plurality of transistors coupled to the drain of a corresponding one of the first plurality of transistors, the gate of each of the second plurality of transistors coupled to the input stage, the source of the least significant bit (LSB) transistor coupled to the non-inverting input of the operational amplifier of the current matching circuit; and
   wherein a corresponding pair of the plurality of switches of the output switching network coupled to the drain of a corresponding one of the second plurality of transistors to switch the output current to the first and the second current output, wherein the corresponding pair including a first switch and a second switch, the first switch coupled to the first current output, the second switch coupled to the second current output.

7. A digital-to-analog converter for converting an N bit digital signal to analog form as recited in claim 3, wherein the first controllable current source is a binary weighted current steering current source and the second controllable current source is a thermometer coded current source.

8. A digital-to-analog converter for converting an N bit digital signal to analog form as recited in claim 7, wherein the first controllable current source, having a first current output and a second current output, comprises:
   a first plurality of transistors, each having a gate, a drain and a source, the gate of each of the first plurality of transistors coupled to receive the current reference signal, the source of each of the first plurality of transistors coupled to the ground terminal;
   a second plurality of transistors, each having a gate, a drain and a source, the source of each of the second plurality of transistors coupled to the drain of a corresponding one of the first plurality of transistors, the gate of each of the second plurality of transistors coupled to the input stage, the source of the most significant bit (MSB) of the second plurality of transistors coupled to the non-inverting input of the operational amplifier of the current matching circuit; and
   wherein a corresponding one of the plurality of switches of the output switching network coupled to the drain of a corresponding one of the second plurality of transistors to switch the output current to the first and the second current output, wherein the corresponding pair including a first switch and a second switch, the first switch coupled to the first current output, the second switch coupled to the second current output.

9. A digital-to-analog converter for converting an N bit digital signal to analog form as recited in claim 7, wherein the second controllable current source, having a first current output and a second current output, comprises:
- a first plurality of transistors, each having a gate, a drain and a source, the gate of each of the first plurality of transistors coupled to output of the operational amplifier, the source of the decoded least significant bit (LSB) transistor coupled to the inverting input of the operational amplifier of the current matching circuit;
- a second plurality of transistors, each having a gate, a drain and a source, each source coupled to the ground terminal, each gate coupled to receive the current reference signal, each drain coupled to a respective source of the first plurality of transistors; and
- wherein a corresponding pair of the plurality of switches of the output switching network coupled to the drain of a corresponding one of the first plurality of transistors to switch the output current to the first and the second current output, wherein the corresponding pair including a first switch and a second switch, the first switch coupled to the first current output, the second switch coupled to the second current output.

10. A method for matching the current within a digital-to-analog-converter (DAC) between a first controllable current source, including at least one first transistor for supplying a first current, and a second controllable current source, including at least one second transistor for supplying a second current, comprising the steps of:
- a. receiving the current from a drain node of the at least one first transistor of the first controllable current source at a noninverting input of an operational amplifier;
- b. receiving the output signal generated by the operational amplifier at the gate of the at least one second transistor of the second controllable current source; and
- c. generating a feedback loop to the operational amplifier by connecting the source of the at least one second transistor of the second controllable current source to the inverting input of the operational amplifier.

11. The method as recited in claim 10, wherein the first controllable current source is a binary weighted current steering current source and the second controllable current source is a thermometer coded current source.

12. The method as recited in claim 10, wherein the first controllable current source is a thermometer coded current source and the second controllable current source is a binary weighted current steering current source.

* * * * *